(12) United States Patent
Nakai et al.

(10) Patent No.: US 8,499,446 B2
(45) Date of Patent: Aug. 6, 2013

(54) METHOD OF MANUFACTURING MULTILAYER PRINTED WIRING BOARD

(75) Inventors: Toru Nakai, Ibi-gun (JP); Sho Akai, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 20 days.

(21) Appl. No.: 13/187,060

(22) Filed: Jul. 20, 2011

(65) Prior Publication Data

US 2011/0272286 A1    Nov. 10, 2011

Related U.S. Application Data

(62) Division of application No. 12/327,444, filed on Dec. 3, 2008.

(60) Provisional application No. 61/033,209, filed on Mar. 3, 2008.

(51) Int. Cl.
*H05K 3/02* (2006.01)
*C25D 5/02* (2006.01)

(52) U.S. Cl.
USPC ............. 29/852; 29/832; 29/847; 29/850; 205/125; 205/126; 174/257; 174/250; 174/258; 174/262; 427/96.1; 427/97.2; 427/97.3; 427/97.9; 427/98.4; 427/99.5

(58) Field of Classification Search
USPC .......... 205/118, 125, 126; 427/96.1, 97.2, 427/97.3, 97.7, 97.9, 98.4, 99.5; 174/257, 174/250, 255, 258, 262, 264; 29/846, 847, 29/850, 852
See application file for complete search history.

(56) References Cited

U.S. PATENT DOCUMENTS

| 4,642,160 | A | * | 2/1987 | Burgess | 216/18 |
| 5,766,740 | A | * | 6/1998 | Olson | 428/209 |
| 6,609,297 | B1 | * | 8/2003 | Hiramatsu et al. | 29/852 |
| 6,709,803 | B2 | * | 3/2004 | Hotta | 430/311 |

(Continued)

FOREIGN PATENT DOCUMENTS

| EP | 1 119 227 A1 | 7/2001 |
| JP | 57076181 A | * | 5/1982 |

(Continued)

OTHER PUBLICATIONS

U.S. Appl. No. 13/211,001, filed Aug. 16, 2011, Nakai, et al.

*Primary Examiner* — Peter DungBa Vo
*Assistant Examiner* — Kaying Kue
(74) *Attorney, Agent, or Firm* — Oblon, Spivak, McClelland, Maier & Neustadt, L.L.P.

(57) ABSTRACT

A method of manufacturing a multilayer printed wiring board includes forming a first interlaminar resin insulating layer, a first conductor circuit on the first interlaminar resin insulating layer, a second interlaminar resin insulating layer, opening portions in the second interlaminar resin insulating layer to expose a face of the first conductor circuit, an electroless plating film on the second interlaminar resin insulating layer and the exposed face, and a plating resist on the electroless plating film. The method further includes substituting the electroless plating film with a thin film conductor layer, having a lower ion tendency than the electroless plating film, and a metal of the exposed face, forming an electroplating film including the metal on a portion of the electroless plating film and the thin film conductor layer, stripping the plating resist, and removing the electroless plating film exposed by the stripping.

10 Claims, 4 Drawing Sheets

U.S. PATENT DOCUMENTS

| | | | |
|---|---|---|---|
| 6,740,540 B2 * | 5/2004 | Tsai et al. | 438/106 |
| 7,335,464 B2 * | 2/2008 | Takano et al. | 430/327 |
| 7,872,803 B2 * | 1/2011 | Uejima et al. | 359/485.05 |
| 2002/0115292 A1 * | 8/2002 | Andricacos et al. | 438/687 |
| 2002/0117400 A1 * | 8/2002 | Hotta | 205/163 |
| 2004/0103813 A1 * | 6/2004 | Yorita et al. | 106/1.12 |
| 2005/0269206 A1 * | 12/2005 | Tanaka et al. | 205/125 |
| 2007/0220744 A1 * | 9/2007 | Kitaoka et al. | 29/846 |
| 2009/0128904 A1 * | 5/2009 | Uejima et al. | 359/486 |
| 2009/0218119 A1 * | 9/2009 | Nakai et al. | 174/257 |
| 2009/0218125 A1 | 9/2009 | Nakai et al. | |

FOREIGN PATENT DOCUMENTS

| | | | |
|---|---|---|---|
| JP | 2-238691 | | 9/1990 |
| JP | 06132631 A | * | 5/1994 |
| JP | 09153544 A | * | 6/1997 |
| JP | 10022270 A | * | 1/1998 |
| JP | 2000-183495 | | 6/2000 |
| JP | 2000-244085 | | 9/2000 |
| JP | 2003-031927 | | 1/2003 |
| JP | 2006-24902 | | 1/2006 |
| JP | 2008-7840 | | 1/2008 |

* cited by examiner

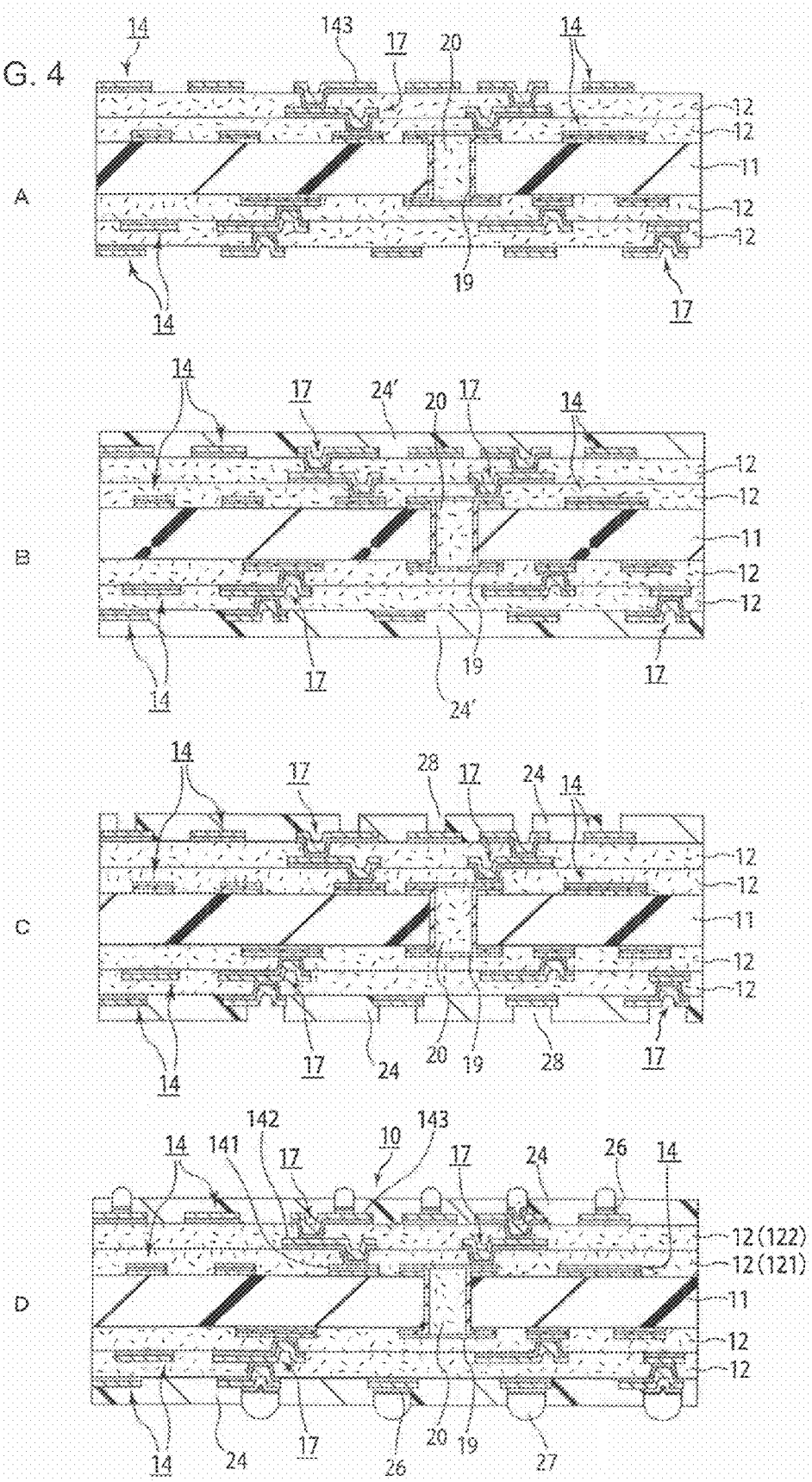

METHOD OF MANUFACTURING MULTILAYER PRINTED WIRING BOARD

CROSS-REFERENCE TO RELATED APPLICATIONS

This application is a divisional of U.S. Ser. No. 12/327,444 filed Dec. 3, 2008, which claims the benefit of priority to U.S. Application No. 61/033,209, filed Mar. 3, 2008. The contents of these applications are incorporated herein by reference in their entirety.

BACKGROUND OF THE INVENTION

1. Field of the Invention

The present invention relates to a method of manufacturing a multilayer printed wiring board.

2. Discussion of the Background

In order to address the needs of faster and smaller electronic devices, there have been demands for finer conductor circuits of a multilayer printed wiring board. Further, in order to meet the demands for finer products, an idea has been offered for a method of forming conductor circuits with the use of a so-called semi-additive method in terms of a method of manufacturing a multilayer printed wiring board.

Laid-Open Japanese Patent Publication No. 2003-31927, the contents of which is incorporated herein by reference in its entirety, discloses a method of forming conductor circuits on an interlaminar resin insulating layer, the method including forming an electroless nickel plating film on the entirety of the surface of a laminate board without a copper foil, forming a plating resist on this electroless nickel plating film, and forming a patterned copper plating film. Also included is subsequently stripping the plating resist, and undertaking a selective etching to remove the electroless nickel plating film, other than the conductor pattern, which has become unnecessary.

The above-noted patent document states that the method allows, since it has the electroless nickel plating film removed with a selective etching, the patterned copper plating layer to remain in nearly the same shape as it was during the etching, and that it presents an advantage for finer conductor circuits.

SUMMARY OF THE INVENTION

Accordingly, it is an object of the present invention to provide a method of manufacturing a multiplayer printed wiring board and a multilayer printed wiring board thereof.

An exemplary embodiment of a method of manufacturing a multilayer printed wiring board includes forming a first interlaminar resin insulating layer, a first conductor circuit on the first interlaminar resin insulating layer, a second interlaminar resin insulating layer, opening portions in the second interlaminar resin insulating layer to expose a face of the first conductor circuit, an electroless plating film on the second interlaminar resin insulating layer and the exposed face, and a plating resist on the electroless plating film. The method further includes substituting the electroless plating film with a thin film conductor layer, having a lower ion tendency than the electroless plating film, and a metal of the exposed face, forming an electroplating film including the metal on a portion of the electroless plating film and the thin film conductor layer, stripping the plating resist, and removing the electroless plating film exposed by the stripping.

An exemplary embodiment of a multilayer printed wiring board includes a first interlaminar resin insulating layer, a first conductor circuit, a second interlaminar insulating layer, an electroless plating film, a thin film conductor layer, and an electroplating film. The first conductor circuit is formed on the first interlaminar resin insulating layer. The second interlaminar resin insulating layer is formed on the first conductor circuit and the first interlaminar resin insulating layer, and includes opening portions to expose a face of the first conductor circuit. The electroless plating film is formed on a portion of the second interlaminar resin insulating layer. The thin film conductor layer is formed on the exposed face and the electroless plating film, has a lower ion tendency than the electroless plating film, and includes a metal of the exposed face of the first conductor circuit. The electroplating film includes the metal formed on the thin film conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A through FIG. 4D are sectional views illustrating steps of a method of manufacturing a multilayer printed wiring board in accordance with an exemplary embodiment.

DETAILED DESCRIPTION OF THE PREFERRED EMBODIMENTS

Figure 1:
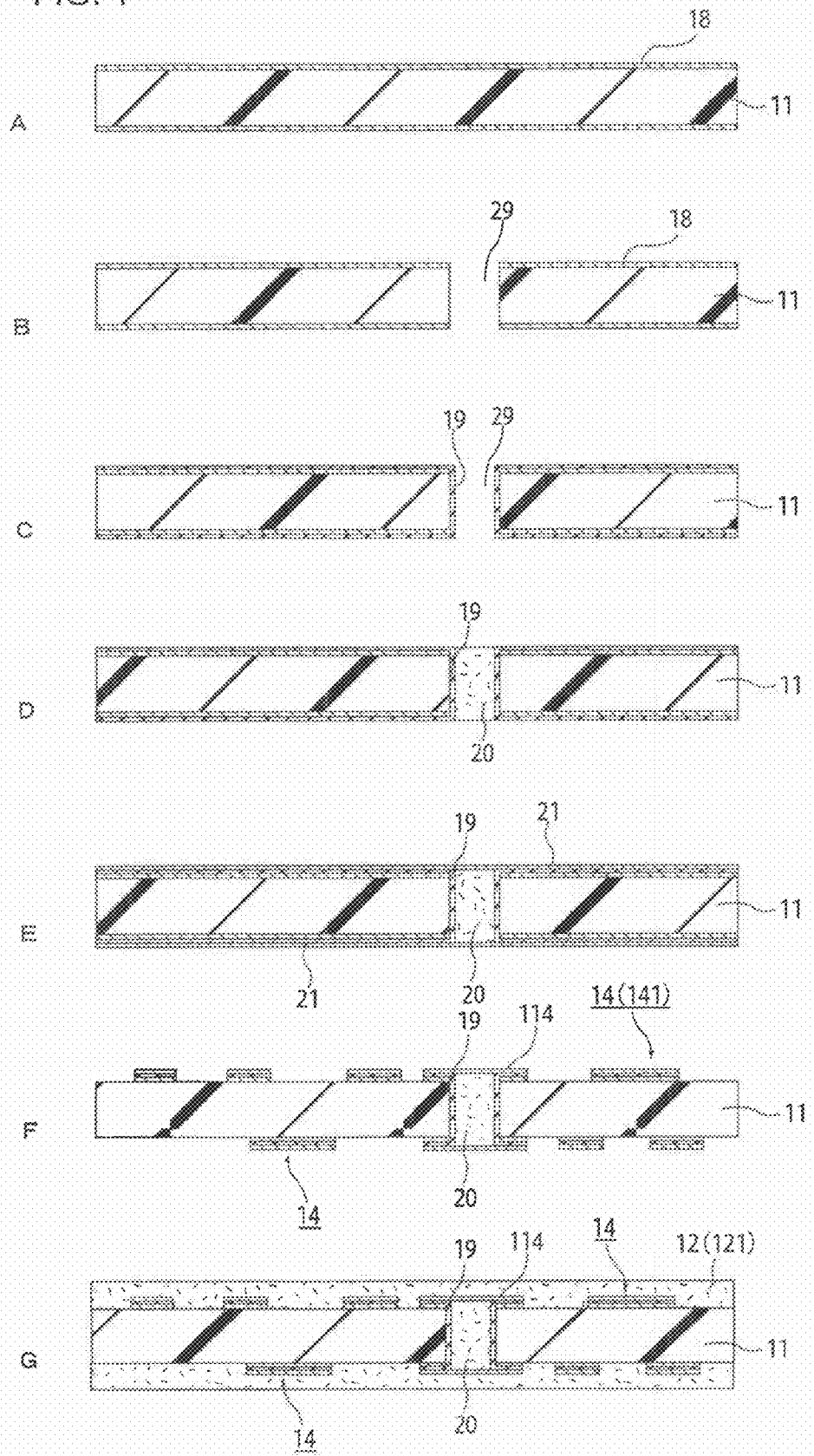
FIG. 1A through FIG. 1G are sectional views illustrating steps of a method of manufacturing a multilayer printed wiring board in accordance with an exemplary embodiment.

When an attempt is made to form, with the application of the method of forming conductor circuits cited in Patent Document 1, via conductors connecting conductor circuits formed on a lower layer interlaminar resin insulating layer and conductor circuits formed on an interlaminar resin insulating layer which is the upper layer thereto, it is believed that the following problems could arise.

Ordinarily, when via conductors are formed, an upper layer interlaminar resin insulating layer is laminated onto a lower layer interlaminar resin insulating layer on which conductor circuits are formed, and opening portions for forming via conductors are formed in this upper layer interlaminar resin insulating layer. Then, those opening portions are electroless-plated and electroplated to form via conductors.

If via conductors were formed with the application of the method cited in Patent Document 1, these via conductors would be formed of an electroless nickel plating film and an electrolytic copper plating film formed on this electroless nickel plating film. Accordingly, it is believed that the conductor circuits formed of copper and formed on the lower layer interlaminar resin insulating layer and the via conductors are connected such that nickel of a different type of metal is present between copper and copper.

Therefore, when via conductors are formed utilizing the method cited in Patent Document 1, it is believed that problems such as (1) through (3), described below, could arise in terms of the connection between the via conductors and the conductor circuits therebelow.

(1) Since they are connected via different types of metal, it presents a poor continuity in crystal lattice and a low connection strength between the conductor circuits and the via conductors.
(2) Nickel and copper present a poor connection reliability on account of the differences in coefficient of linear expansion and in elastic modulus, and, in particular, a poor connection reliability following a heat cycle test.
(3) Since nickel is higher in electrical resistance than copper, it elevates the electrical resistance between conductor circuits and via conductors.

The present inventors found, as a result of their diligent research, a method of enhancing the connectivity between conductor circuits and via conductors while meeting the demands for finer conductor circuits, and completed a method of manufacturing a multilayer printed wiring board in accordance with the present invention.

The example embodiments will now be described with reference to the accompanying drawings.

A method of manufacturing a multilayer printed wiring board pertaining to an exemplary embodiment will be described in the order of steps.

(1) With an insulating substrate as a starting material, first, conductor circuits are formed on said insulating substrate. However, the substrate is not limited to the insulating substrate, and a resin substrate such as, to give some examples, a glass epoxy substrate, a bismaleimide triazine (BT) resin substrate, a copper-clad laminate board, and an RCC substrate, a ceramic substrate such as an aluminum nitride substrate, a silicone substrate, etc., may be used. Further, the conductor circuits may be formed by etching after a plain conductor layer is formed on the surface of the insulating substrate with electroless plating, for example. Moreover, through-hole conductors to make a connection between the conductor circuits sandwiching the insulating substrate may be formed, and the surfaces of the conductor circuits may be roughened with etching, etc., as necessary, following the formation of the conductor circuits.

(2) Next, on the insulating substrate on which the conductor circuits have been formed, there is formed an interlaminar resin insulting layer and at the same time there are formed in this interlaminar resin insulating layer opening portions reaching the conductor circuits on the insulating substrate. For example, the interlaminar resin insulating layer may be formed by a thermosetting resin, a photosensitive resin, a resin in which a photosensitive group is added into a portion of a thermosetting resin, or a resin complex containing a combination thereof and a thermoplastic resin, etc.

Specifically, first, a resin layer is formed by coating an unhardened resin with a roll coater, a curtain coater, etc., or a resin film being thermo-compression bonded. Then, the resin is hardened as necessary. At that juncture, the opening portions are formed with a laser treatment, exposure and development to form an interlaminar resin insulating layer having the opening portions. For example, it will suffice to form a resin layer including the thermoplastic resin by a resin molded material molded in a film shape that is thermo-compression-bonded.

(3) Next, on the surface of the interlaminar resin insulating layer (including the wall faces of the opening portions) and on the exposed faces of the conductor circuits on the insulating substrate exposed by the opening portions there is formed an electroless nickel plating film. Specifically, a palladium catalyst is adhered to the surface of the interlaminar resin insulating layer (including the wall faces of the opening portions) and to the exposed faces of the conductor circuits. Then, the electroless nickel plating film is formed by it being immersed in an electroless nickel plating aqueous solution. The electroless nickel plating film is preferably 0.1 to 2.0 μm in thickness. Further, the surface of the interlaminar resin insulating layer may be pre-roughened prior to the formation of the electroless nickel plating film.

When an electroless nickel plating film is formed, the electroless nickel plating film is preferably formed such that it densely covers, with certainty, the entirety of the surface of the interlaminar resin insulating layer and that it coarsely covers, if at all possible, the exposed faces of the conductor circuits. The electroless nickel plating film on the surface of the interlaminar resin insulating layer needs to, with certainty, cover the surface of the interlaminar resin insulating layer, as it functions as a seed layer during the subsequent step of forming an electroplating film. The electroless nickel plating film on the exposed faces of the conductor circuits is an unnecessary element for via conductors that are completed, and, it is preferably formed coarsely, if at all possible, as the conductor circuits themselves exposed by the opening portions can function as a seed layer during the subsequent step of forming an electroplating film.

In order to form such an electroless nickel plating film, it will suffice to set the amount of palladium catalyst to be adhered prior to the electroless plating to be large as to the surface of the interlaminar resin insulating layer and small as to the exposed faces of the conductor circuits. Accordingly, as for a method of adjusting the amount of palladium catalyst, with the polarity of the interlaminar resin insulating layer and the polarity of the palladium catalyst being set to be opposing polarities and the polarities of the exposed faces of the conductor circuits and of the palladium catalyst being like polarities (positive polarities or negative polarities), for example, a method of adhering palladium catalyst may be used.

(4) Next, a plating resist is formed on the electroless nickel plating film. The plating resist is formed on the portions where conductor circuits and via conductors are not formed. The plating resist may be formed by being exposed and developed after a photosensitive dry film has been bonded, for example.

(5) Next, the electroless nickel plating film formed on the exposed faces of the conductor circuits 141 (e.g., the first conductor circuits 141 illustrated in FIG. 4D) on the insulating substrate exposed by the opening portions is substituted with a thin film conductor layer having copper by the substitution copper plating. A thin film conductor layer having copper is a thin film conductor layer having copper for a principal constituent of a thin film conductor layer. It is a thin film conductor layer having the atomic % of copper in the thin film conductor layer that is no less than 50%. Specifically, it is undertaken by a substrate having undergone up to the formation of the plating resist being immersed in a substitution copper plating solution.

Further, when substitution copper plating is undertaken with this method, not only the electroless nickel plating film formed on the exposed faces of the conductor circuits, but also the electroless nickel plating film, of the electroless nickel plating film formed on the interlaminar resin insulating layer (e.g., the second interlaminar resin insulating layer 122 illustrated in FIG. 4D), on the portion where no plating resist has been formed can be substituted with a thin film conductor layer having copper.

Accordingly, when the electroless plating film on the exposed faces of the first conductor circuits is substituted, the electroless plating film on the portion where no plating resist has been formed is also substituted. As a result, the amount of a different type of metal in the conductor circuits formed on the second interlaminar resin insulating layer is reduced, resulting in the improved electrical property of the manufactured multilayer printed wiring board. Further, when a portion of nickel of the electroless nickel plating film is substituted with copper to provide a thin film conductor layer having copper, the adhesion strength between the conductor circuits (e.g., the second conductor circuits 142 illustrated in FIG. 4D) and the second interlaminar resin insulating layer to be described later and the adhesion strength between the thin film conductor layer and the electroplating film on the thin film conductor layer are elevated. It is thought that this is due to the excellent adhesion with the underlayer resin insulating layer since the thin film conductor layer has nickel. Additionally, it is thought that it is due to the excellent adhesion with the electrolytic copper plating film formed on the thin film conductor layer since the thin film conductor has copper. Further, the conductor circuits include the thin film conductor layer and the electroplating film on the thin film conductor layer, as described in the following.

The thin film conductor layer on the first conductor circuits may be a thin film conductor layer including copper. In this case, it results in the connection reliability between the first conductor circuits and via conductors formed on the first conductor circuits being enhanced and the connectivity resistance becoming low. Further, the thin film conductor layer including copper is a thin film conductor layer in which all of the nickel in the electroless nickel plating film is substituted with copper. When it comes to the substitution plating, the electroless nickel plating film on the portion where a plating resist has not been formed on the interlaminar resin insulating layer can be substituted with a thin film conductor layer including copper. In this case, the resistance value of the conductor circuits declines.

In order to substitute only a portion of the electroless nickel plating film on the interlaminar resin insulating layer with a copper plating film while the electroless nickel plating film on the exposed faces of the conductor circuits is being completely substituted with a copper plating film, it will suffice to end substitution copper plating at the point in time when the substitution of the electroless nickel plating film on the exposed faces of the conductor circuits ends. As described above, the electroless nickel plating film tends to form more densely on the interlaminar resin insulating layer than on the exposed faces of the conductor circuits. Accordingly, if the substitution copper plating ends at the point in time when the electroless nickel plating film on the exposed faces of the conductor circuits is completely substituted, only a portion of the electroless nickel plating film on the interlaminar resin insulating layer is substituted. Further, as opposed to the electroless nickel plating film on the exposed faces of the conductor circuits in which the lower layer thereof is a conductor layer, in the electroless nickel plating film on the interlaminar resin insulating layer, the lower layer thereof is a non-conductor layer (a resin layer). Accordingly, it leads to the electroless nickel plating film on the conductor circuits being more easily substituted than the electroless nickel plating film on the interlaminar resin insulating layer. Therefore, if the substitution copper plating ends at the point in time when the electroless nickel plating film on the exposed faces of the conductor circuits is completely substituted, only a portion of the electroless nickel plating film on the interlaminar resin insulating layer is substituted. Further, with the control over the treatment time of the substitution treatment, a portion of nickel of the electroless nickel plating film could be substituted with a thin film conductor layer having copper, or the entirety of nickel of the electroless nickel plating film could be substituted with copper to provide a thin film conductor layer having copper.

(6) Next, an electrolytic copper plating film is formed on the portions where the plating resist is not formed and on the thin film conductor layer formed on the exposed faces of the conductor circuits. The electrolytic copper plating is undertaken with a method well known in the art. Further, the electrolytic copper plating film is preferably 5 to 20 μm in thickness.

(7) Then, the plating resist on the interlaminar resin insulating layer is stripped. For example, by stripping the plating resist with an alkali aqueous solution, etc.

(8) Next, the electroless nickel plating film (the electroless nickel plating film between electrolytic copper plating films) exposed by the stripped plating resist is removed. The electroless nickel plating film may be removed, for example, with the use of an etchant, and, in particular, it is preferable to use an etchant capable of selectively etching nickel. As for the etchant capable of selectively etching nickel, MEC Remover NH-1865 made by MEC Corporation, for example, etc., may be used.

The removal with certainty of an electroless plating film is preferably undertaken with the use of an etchant. Further, the selection of an etchant allows an electroplating film to selectively be not etched and an electroless plating film to be removed with certainty. During the step of removing an electroless plating film, the use of such a selective etchant does not allow the electrolytic plating film to be etched. Therefore, in forming independent conductor circuits there is no need to have formed an electroplating film wider than the finished product on account of a projection that a portion of the electroplating film be removed. Accordingly, the etchant is suited to form fine conductor circuits having a low L/S (line/space).

The undertaking of steps (3) through (8) allows conductor circuits on the interlaminar resin insulating layer to be formed and, at the same time, via conductors for connecting conductor circuits to be formed on different interlaminar resin insulating layers. In addition, in the above-described steps (1) through (8), the insulating substrate (e.g., the insulating substrate 11 illustrated in FIG. 1) corresponds to a first interlaminar resin insulating layer. Further, the catalyst on the interlaminar resin insulating layer may be removed with an acid or an oxidizer, as necessary, following the formation of the conductor circuits. Thus, preventing the electrical property from declining.

(9) Further, an interlaminar resin insulating layer and conductor circuits may be formed and, at the same time, via conductors may be formed with the steps of the above-described (2) through (8) being repeated as necessary. In addition, when this step (9) is undertaken, the interlaminar resin insulating layer formed under the step of the above-described (2) corresponds to the first interlaminar resin insulating layer (e.g., the interlaminar resin insulating layer 121 illustrated in FIG. 4D), and the interlaminar resin insulating layer formed under the step of the above-described (9) corresponds to the second interlaminar resin insulating layer (e.g., the interlaminar resin insulating layer 122 illustrated in FIG. 4D). Further, the conductor circuits 142 correspond to the first conductor circuits, and the conductor circuits 143 correspond to the second conductor circuits, as illustrated, e.g., in FIG. 4D.

(10) Lastly, a solder resist layer and solder bumps are formed to complete a multilayer printed wiring board. Specifically, on the uppermost layer interlaminar resin insulating layer including conductor circuits there is coated a solder resist composition with a roll coater, etc., to which an opening treatment is carried out with laser treatment, exposure and development, etc., and a solder resist layer is formed by a hardening treatment, etc., being carried out. Then, solder bumps are formed in the opening portions of the solder resist layer to finish the manufacture of a printed wiring board.

With respect to a multilayer printed wiring board manufactured with the use of such a method of manufacture, all of the via conductors are formed of copper, and the via conductors and the exposed faces of the conductor circuits therebelow are formed of the identical metal (copper).

According to the above-described method of manufacture, the electroless nickel plating film between electrolytic copper plating films can be removed with the use of an etchant selectively etching nickel when independent conductor circuits are formed. In addition, via conductors connecting the lower layer conductor circuits including copper and the upper layer conductor circuits are formed on the lower layer conductor circuits and include a thin film conductor layer having copper and an electrolytic copper plating film formed on the thin film conductor layer. Accordingly, the formation of fine conductor circuits and the securing of the interlaminar connection reliability of via conductors can both be attainable together.

Further, with respect to a multilayer printed wiring board manufactured in accordance with the above-described method of manufacture, conductor circuits and a thin film conductor formed on those conductor circuits, as well as a thin film conductor and an electroplating film formed on that thin film conductor layer have the same type of metal (copper). Accordingly, as compared to the via conductors formed with the application of the method of forming conductor circuits as set forth in Patent Document 1, the crystal lattices between the two become more likely to match in the via conductors formed with the above-described manufacturing method. Thus, the connection strength between the first conductor circuits and the thin film conductor, and between the thin film conductor and the electroplating film on the thin film conductor, becomes elevated.

Further, the via conductors formed with the above-described manufacturing method exhibit, as compared to the via conductors formed with the application of the method of forming conductor circuits as set forth in Patent Document 1, exhibited an excellent connection reliability following a temperature cycle test. The via conductors formed with the above-described manufacturing method exhibit, as they are low in electrical resistance, an excellent electrical property as compared to the via conductors formed with the application of the method of forming conductor circuits set forth in Patent Document 1.

With the above-described method of manufacture, it is possible that the electroless nickel plating film on the exposed faces of the conductor circuits is completely substituted and that the electroless nickel plating film on the interlaminar resin insulating layer (including the wall faces of the opening portions) is not completely substituted but only a portion thereof is substituted. In this case, finer conductor circuits can be achieved. Further, the interlaminar connectivity of via conductors can be enhanced. The adhesion between an interlaminar resin insulating layer and conductor circuits formed on that interlaminar resin insulating layer can be enhanced. Moreover, the adhesion between the interlaminar resin insulting layer and the conductor circuits formed on that interlaminar resin insulating layer can be enhanced.

The exemplary embodiment will be described in more detail in the following examples. However, embodiments in accordance with the present invention are not limited to only the following examples.

EXAMLE 1

A. Preparation of Resin Filler 100 parts by weight of bisphenol F-type epoxy monomer (made by Yuka Shell KK, molecular weight: 310, YL983U), 170 parts by weight of $SiO_2$ spheroidal particulates (made by Adotech, CRS 1101-CE) having a surface coated with a silane coupling agent with an average particulate diameter of 1.6 μm and a diameter of the maximum particulate being no greater than 15 μm, and 1.5 parts by weight of a leveling agent (made by Sun Nopco Co., Ltd, Perenol S4) were placed in a container, which was stirred and mixed to prepare a resin filler with a viscosity of 45 to 49 Pa·s at 23±1° C. In addition, an imidazole curing agent (made by Shikoku Chemicals Corp., 2E4MZ-CN) in 6.5 parts by weight was used as a curing agent.

B. Manufacture of Multilayer Printed Wiring Board (1) The starting material was a copper-clad laminate board. The copper-clad laminate board includes an insulating substrate 11 formed of a 0.8 mm-thick glass epoxy resin and a 18 μm copper foil 18 laminated on both surfaces of the insulating substrate 11, as illustrated in FIG. 1A. Next, as illustrated in FIG. 1B, holes were drilled in this copper-clad laminate board such that through holes 29 for through-hole conductors were formed.

(2) Next, as illustrated in FIG. 1C, the copper foils 18 and the surfaces of the through holes 29 were electroless-copper-plated and electrolytic-copper-plated to form conductor layers including through-hole conductors 19 including the electroless copper plating film and the electrolytic copper plating film.

(3) Next, after the substrate in which through-hole conductors 19 had been formed was washed in water and dried, it underwent a blacking process with an aqueous solution containing NaOH (10 g/l), $NaClO_2$ (40 g/l), and $Na_3PO_4$ (6 g/l) as a blacking bath (an oxidation bath) and a reduction process with an aqueous solution containing NaOH (10 g/l) and $NaBH_4$ (6 g/l) as a reduction bath to form roughened faces (not illustrated) out of the surfaces of the through-hole conductors 19.

(4) Next, as illustrated in FIG. 1D, the through-hole conductors 19 were filled in with the resin filler described under Section A, described above, with the method described below. Namely, after the resin filler had first been squeezed into the through-hole conductors with the use of a squeegee, it was dried under the conditions that are at 100° C. and for 20 minutes. Subsequently, one face of the substrate was sanded by belt-sander grinding using a #600 belt-sanding sandpaper (made by Sankyo Rikagaku Co., Ltd.) such that the resin filler 20 does not remain on the electrolytic copper plating film, which was, next, buffed to remove any marring due to the belt-sander grinding. A similar series of grinding was likewise performed on the other face of the substrate. Next, it was heated at 100° C. for one hour, at 120° C. for three hours, at 150° C. for one hour, and at 180° C. for seven hours to form resin filler layers 20.

(5) Next, as illustrated in FIG. 1E, a conductor layer 21 including an electroless copper plating film and an electrolytic copper plating film was formed on the electrolytic copper plating film and the resin filler 20. Further, as illustrated in FIG. 1F, conductor circuits 14 were formed on the insulating substrate 11 with a subtractive method. At that time, conductor circuits 114 concurrently covering the resin filler 20 were also formed.

(6) Next, after having been washed in water and acid-degreased, the substrate was soft-etched, and, subsequently, the entirety of the surface (including the land surface of the through-hole conductors 19) of the conductor circuits 14 was roughened (not illustrated) by the surfaces of the conductor circuits 14 (including the conductor circuits 114 covering the resin filler 20) being etched with an etchant sprayed on both faces of the substrate with a sprayer. As for the etchant, an etchant containing 10 parts by weight of imidazole-copper (II) complex, 7 parts by weight of glycolic acid, and 5 parts by weight of potassium chloride (made by MEC Corporation, MEC Bond) was used.

(7) Next, as illustrated in FIG. 1G, an interlaminar resin insulating layer 12 was formed on the insulating substrate 11 and the conductor circuits 14 with the use of a film for interlaminar resin insulating layer formation (made by Ajinomoto Co., Inc., ABF). Namely, a film for interlaminar resin insulating layer formation was compression-bonded on the substrate under the conditions of a vacuum of 65 Pa, a pressure of 0.4 MPa, the temperature at 80° C., and the time for 60 seconds, which, then, was thermoset at 170° C. for 30 minutes to form an interlaminar resin insulating layer 12.

Figure 2:
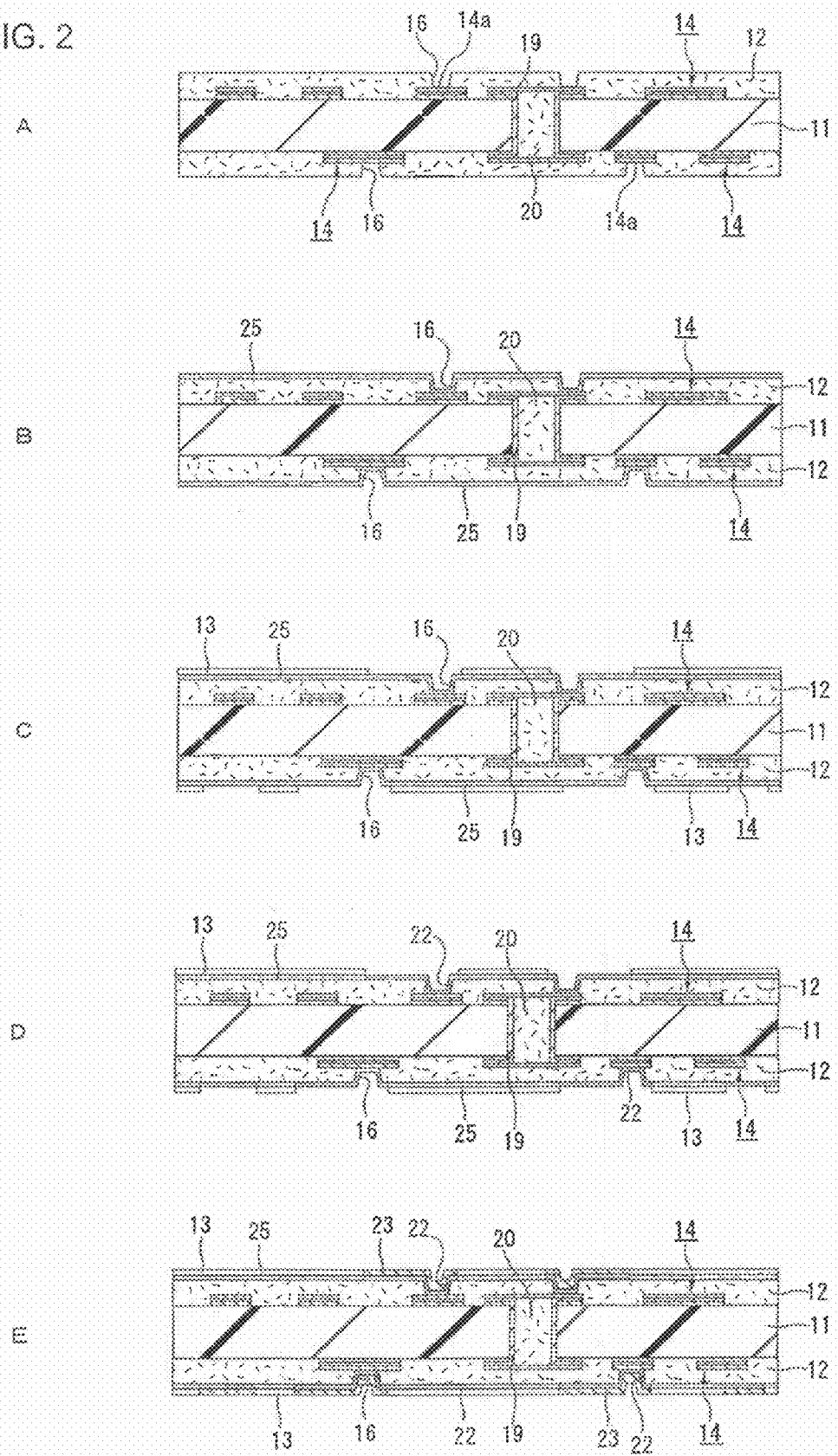
FIG. 2A through FIG. 2E are sectional views illustrating steps of a method of manufacturing a multilayer printed wiring board in accordance with an exemplary embodiment.

(8) Next, as illustrated in FIG. 2A, opening portions 16 having a diameter of 80 μm were formed in the interlaminar resin insulating layer 12 with a $CO_2$ gas laser. As a result, a portion (the exposed face 14a) of the conductor circuits 14 was exposed by the opening portion 16.

(9) Next, the substrate in which the opening portions 16 were formed was immersed in an 80° C. solution containing 60 g/l of permanganic acid for 10 minutes such that the surface of the interlaminar resin insulating layer 12 including the inner wall faces of the opening portions 16 was roughened (not illustrated).

(10) Next, the substrate which had been subjected to the above-treatment was immersed in a neutralization solution (made by Shipray Co.) and then washed in water. Further, a palladium catalyst (not illustrated) was applied to the surface of the interlaminar resin insulating layer 12 (including the inner wall faces of the opening portions 16) and the exposed faces 14a of the conductor circuits exposed by the opening portions 16. Specifically, the substrate was immersed in Activator Neoganth 834 conc (made by Atotech Corp.), and the catalyst was applied by metal palladium being deposited.

(11) Next, as illustrated in FIG. 2B, the substrate to which a palladium catalyst had been applied was immersed in a nickel boron bath (made by Uemura Industries Co., Ltd., KLP VERI) such that an electroless nickel plating film 25 was formed on the surface of the interlaminar resin insulating layer 12 (including the inner wall faces of the opening portions 16) and the exposed faces 14a of the conductor circuits exposed by the opening portions 16. In addition, the electroless nickel plating film 25 is 1 μm in thickness on the surface of the interlaminar resin insulating layer 12 and 0.5 μm in thickness on the exposed faces 14a of the conductor circuits.

(12) Next, as illustrated in FIG. 2C, a commercially available photosensitive dry film was bonded on the electroless nickel plating film 25, which was exposed and developed with a mask having been placed such that a 25 μm-thick plating resist 13 was provided.

(13) Next, as illustrated in FIG. 2D, the substrate on which a plating resist 13 had been formed was immersed in a substitution copper plating solution (1M $CuSO_4.5H_2O$), which was subjected to substitution copper plating for 3 minutes whereby an electroless nickel plating film 25 is substituted with a copper plating film to form a thin film conductor layer 22. In addition, although it is depicted as if the predetermined electroless nickel plating film was completely substituted with a copper plating film, as to the present treatment, the electroless nickel plating film 25 on the exposed faces 14a of the conductor circuits may be completely substituted with the copper plating film, while only a portion of the remaining electroless nickel plating film 25 may be substituted from nickel to copper.

(14) Next, as illustrated in FIG. 2E, the substrate on which a thin film conductor layer 22 has been formed was washed in 50° C. water and degreased, and after having been washed in 25° C. water and further in sulfuric acid, it was electroplated under the following conditions to form an electrolytic copper plating film 23 on the portion where a plating resist 13 was not formed.

Electrolytic Copper Plating Solution:
Sulfuric acid: 150 g/L
Copper sulfide: 150 g/L
Chlorine ion: 8 mg/L
Additives: 4 ml/L (made by Okuno Chemical Industries Co. Ltd., Top Lucina NSV-1)
   0.5 ml/L (made by Okuno Chemical Industries Co. Ltd., Top Lucina NSV-2)
   1 ml/L (made by Okuno Chemical Industries Co. Ltd., Top Lucina NSV-3)
Electroplating Conditions:
Electro current density: 1 A/dm$^2$
Time: 90 minutes
Temperature: 23° C.

Figure 3:
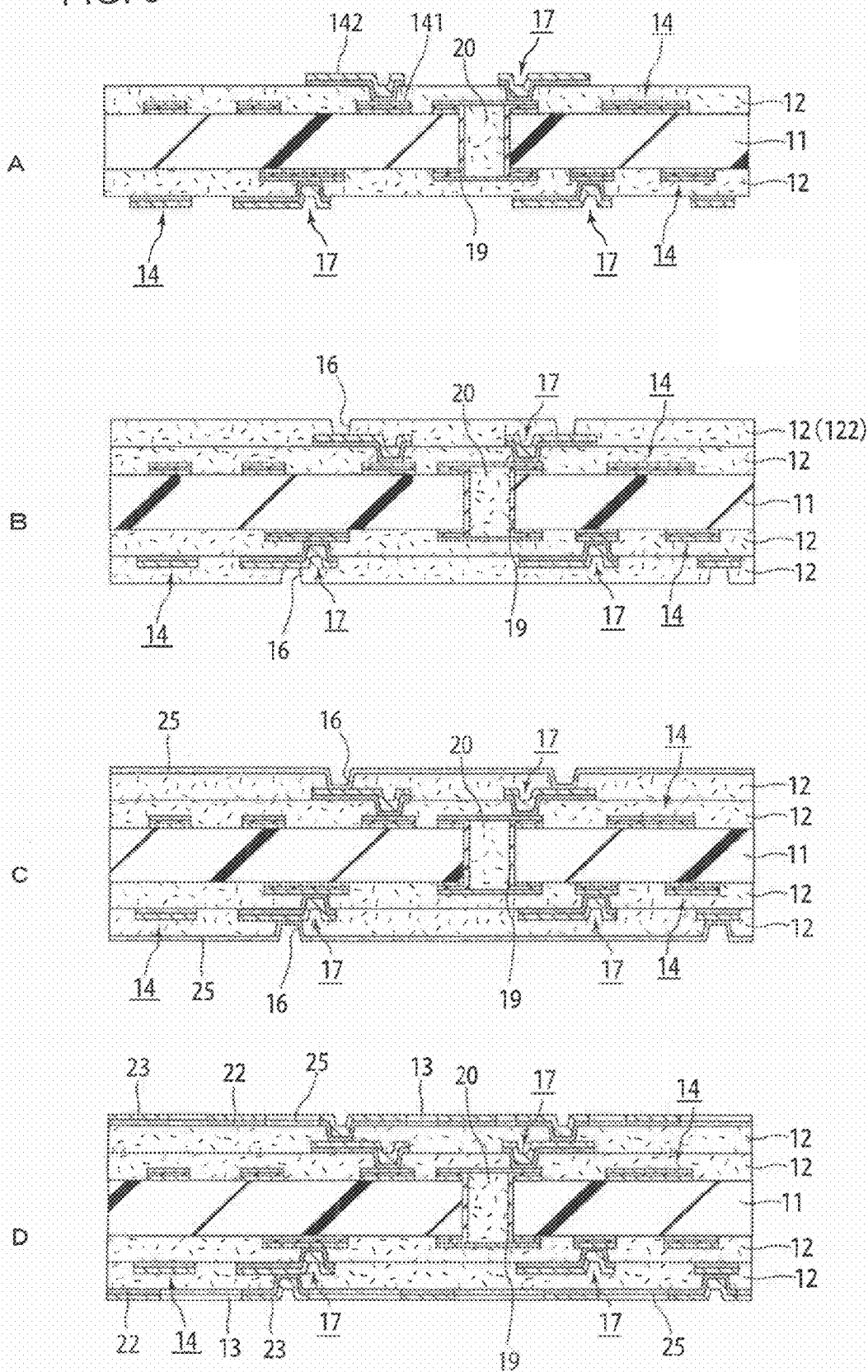
FIG. 3A through FIG. 3D are sectional views illustrating steps of a method of manufacturing a multilayer printed wiring board in accordance with an exemplary embodiment.

(15) Next, as illustrated in FIG. 3A, the plating resist 13 was stripped and removed. Further, the electroless nickel plating film 25 between the adjacent electrolytic copper plating films was etched with a nickel selective etchant (made by MEC Corporation, NH-1865, or another etchant such as NH-1860), dissolved and removed, and conductor circuits 14 including the thin film conductor layer 22 and the electrolytic copper plating film 23 on the thin film conductor layer and via conductors 17 were formed. In addition, the minimum value for the L/S (line/space) of the conductor circuits 14 in the example was set to be 8 μm/8 μm.

(16) Next, as illustrated in FIG. 3B, with the use of an etchant similar to the etchant used during the step (6) described above, the surfaces of the conductor circuits 14 and the via conductors 17 were roughened (not illustrated), and, next, likewise as with the steps (7) through (9) described above, an interlaminar resin insulating layer 12 having opening portions 16 and the surface of which had been roughened (not illustrated) was formed.

(17) Next, as illustrated in FIG. 3C through FIG. 4A, with the use of a method similar to the method used under the steps (10) through (15) described above, conductor circuits 14 and via conductors 17 were formed.

(18) Next, as illustrated in FIG. 4B, a commercially available solder resist composition was coated in 30 μm in thickness on the outermost layer of the interlaminar resin insulating layer 12 and the conductor circuit 14, which was dried under the conditions that are at 70° C. for 20 minutes and at 70° C. for 30 minutes such that a commercially available solder resist layer 24' was formed.

(19) Next, as illustrated in FIG. 4C, a 5 mm-thick photomask on which a pattern for openings for solder bump formation was drawn was contact-adhered to the solder resist composition layer 24' and exposed with an ultraviolet ray of 1,000 mJ/cm$^2$, developed with the DMTG solution such that openings for solder bump formation 28 were formed.

Further, it was subjected to heating under each of the conditions that were at 80° C. for one hour, at 100° C. for one hour, at 120° C. for one hour, and at 150° C. for three hours such that the solder resist composition layer 24' became hardened to form a solder resist layer 24 (20 μm in thickness) having openings for solder bump formation 28.

(20) Next, the substrate on which the solder resist layer 24 was formed was immersed in an electroless nickel plating solution containing nickel chloride ($2.3\times10^{-1}$ mol/l), sodium hypophosphite ($2.8\times10^{-1}$ mol/l), and sodium citrate ($1.6\times10^{-1}$ mol/l) with pH=4.5 for 20 minutes such that a 5 µm-thick nickel plating layer was formed in the openings for solder bump formation 28. Further, that substrate was immersed in an electroless gold plating solution containing potassium gold cyanide ($7.6\times10^{-3}$ mol/l), ammonium chloride ($1.9\times10^{-1}$ mol/l), sodium citrate ($1.2\times10^{-1}$ mol/l), and sodium hypophosphite ($1.7\times10^{-1}$ mol/l) under the condition that is at 80° C. for 7.5 minutes such that a 0.03 µm-thick gold plating layer was formed on the nickel layer providing solder pads 26.

(21) Next, as illustrated in FIG. 4D, a solder paste was printed over the openings for solder bump formation 28 formed in the solder resist layer 24 such that solder bumps 27 were formed by reflow at 200° C., completing a multilayer printed wiring board 10.

Other Embodiments

In a method of manufacturing a multilayer printed wiring board pertaining to the exemplary embodiment, on the surface of the interlaminar resin insulating layer and the exposed faces of the conductor circuits on the insulating substrate exposed by the opening portions there is formed an electroless nickel plating film as an electroless plating film. However, electroless plating film is not limited to the electroless nickel plating film and, in other embodiments in accordance with the present invention, the electroless plating film may be an electroless tin plating film, an electroless zinc plating film, an electroless iron plating film, etc. These electroless plating films are also suitable, as their ionization tendencies are greater than copper, for the formation of a thin film conductor layer with substitution copper plating at a later step.

Further, the material for the thin film conductor layer to be formed with substitution plating is not limited so long as it is a metal having a lower ionization tendency than the electroless plating film, and it will suffice to select a metal satisfying the above-described condition for ionization tendency of copper, etc.

Further, in the exemplary embodiment, while the electroless nickel plating film on the exposed faces of the conductor circuits is completely substituted and only a portion of the electroless nickel plating film on the interlaminar resin insulating layer (including the wall faces of the opening portions) is substituted, the electroless nickel plating film on the interlaminar resin insulating layer may, alternatively, be completely substituted with a copper plating film or may not be substituted at all.

As with the step (9) under a method of manufacturing a multilayer printed wiring board pertaining to the exemplary embodiment, when further conductor circuits and interlaminar resin insulating layers are formed, the number of the repetition thereof is not limited, and it may be twice or more. Further, with respect to a method of manufacturing a multilayer printed wiring board pertaining to the exemplary embodiment, while the total number of interlaminar resin insulating layers is the same for both sides of the insulating substrate, the total numbers may, alternatively, vary from one side to the other of the insulating substrate.

According to embodiments of the present invention, after an electroless plating film has been formed on the exposed faces of the first conductor circuits, this electroless plating film is substituted with a thin film conductor layer having the same metal as the metal constituting the exposed faces of the first conductor circuits. Then, via conductors are formed by an electroplating film including the same metal (the metal deposited by the substitution metal) as the thin film conductor layer being formed on this thin film conductor layer. As to the via conductors formed, since the first conductor circuits and the thin film conductor layer, as well as the thin film conductor layer and the electroplating on the thin film conductor layer, are connected via a same type of metal, it results in a high connection strength and an excellent connection reliability. Further, for the first conductor circuits and the electroplating film, copper is preferred on account of the electrical resistance and the ease of formation.

Further, the electroless plating film is preferably an electroless nickel film, and the thin film conductor layer preferably includes a thin film conductor layer having copper or a thin film conductor layer including copper, and the electroplating film is preferred to be an electrolytic copper plating film. An electroless plating film including nickel is easily formed, and a thin film conductor layer having copper or a thin film conductor layer including copper is easily formed with substitution plating. Further, a thin film conductor layer having copper and a thin film conductor layer including copper and an electrolytic copper film are suited as constituent materials for via conductors as they are low in electrical resistance.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a multilayer printed wiring board, comprising:
    forming a first interlaminar resin insulating layer;
    forming a first conductor circuit on the first interlaminar resin insulating layer;
    forming a second interlaminar resin insulating layer on the first conductor circuit and the first interlaminar resin insulating layer;
    forming an opening portion in the second interlaminar resin insulating layer to expose a face of the first conductor circuit;
    forming an electroless plating film on a surface of the second interlaminar resin insulating layer and the exposed face of the first conductor circuit;
    forming a plating resist on a portion of the electroless plating film;
    substituting the electroless plating film formed on the exposed face and the second interlaminar resin, on which the plating resist is not formed, with a thin film conductor layer, the thin film conductor layer having a lower ion tendency than the electroless plating film and including a metal of the exposed face of the first conductor circuit;
    forming an electroplating film including the metal on the thin film conductor layer;
    stripping the plating resist, and
    removing the electroless plating film exposed by the stripping of the plating resist.

2. The method as set forth in claim 1, wherein the substituting comprises substituting a fraction of the electroless plating film on the portion of the electroless plating film, on which the plating resist is not formed, with the thin film conductor layer.

3. The method as set forth in claim 1, wherein
    the electroless plating film includes nickel; and
    the electroplating film includes copper.

4. The method as set forth in claim 1, wherein the removing comprises removing the electroless plating film with an etchant.

5. The method as set forth in claim 4, wherein the etchant does not substantially etch the electroplating film.

6. The method as set forth in claim 1, wherein the first interlaminar resin insulating layer includes glass fiber as a core material.

7. The method as set forth in claim 1, further comprising:
adhering a palladium catalyst to a surface of the second interlaminar resin insulating layer and the exposed face of the first conductor circuit,
wherein the forming the electroless plating film comprises forming the electroless plating film on the palladium catalyst.

8. The method as set forth in claim 7, wherein the adhering the palladium catalyst comprises adhering a first amount of the palladium catalyst to the surface of the second interlaminar resin insulating layer and a second amount of the palladium catalyst to the exposed face of the first conductor circuit.

9. The method as set forth in claim 8, wherein the first amount is greater than the second amount.

10. The method as set forth in claim 1, wherein the substituting the electroless plating film comprises substituting the electroless plating film on the second interlaminar resin insulating layer until the electroless plating film formed on the exposed faces of the conductor circuits is completely substituted with the thin film conductor layer.

* * * * *